United States Patent
Belk

(10) Patent No.: US 6,289,298 B1
(45) Date of Patent: Sep. 11, 2001

(54) METHOD AND APPARATUS FOR QUASI FULL-WAVE MODELING OF INTERACTIONS IN CIRCUITS

(75) Inventor: Nathan R. Belk, Scotch Plains, NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/283,393

(22) Filed: Apr. 1, 1999

(51) Int. Cl.[7] ........................................ G06F 15/00
(52) U.S. Cl. ...................................... 703/5; 716/4
(58) Field of Search ........................... 703/5, 14; 716/4

(56) References Cited

U.S. PATENT DOCUMENTS

| | | | |
|---|---|---|---|
| 5,051,911 | 9/1991 | Kawasaski et al. | 703/15 |
| 5,497,337 | * 3/1996 | Ponnapalli | 716/19 |
| 5,903,477 | * 5/1999 | Otsu | 703/5 |
| 6,064,808 | * 5/2000 | Kapur | 703/2 |
| 6,185,517 | * 2/2001 | Ohtsu | 703/4 |

OTHER PUBLICATIONS

Belk et al., "The simulation and design of Integrated inductors", Proceedings of the 36th Design Automation Conference, pp. 988–993, Jun. 1999.*

Ehsani et al., "Computer–aided desing and application of integrated Ic filters", IEEE Transactions on Power Electronics, vol. 11, issue 1, pp. 182–190, Jan. 1996.*

* cited by examiner

Primary Examiner—John F. Niebling
Assistant Examiner—Stacy Whitmore

(57) ABSTRACT

Electrodynamically determined electric field and/or current distributions are employed in conjunction with statically determined electric field distributions localized to metalization structures on a conductive substrate to model metal structures to be fabricated on a substrate. Specifically, the static electric field distributions are subtracted from the electrodynamic field distributions and the results are used to determine the electrodynamic component of self and mutual interactions between metalization structures to be fabricated on the conductive substrate. Then, statically determined current interactions of the metalization structures to be fabricated are determined and superimposed on the electrodynamic interactions. The results of the superimposition are used to generate the overall integrated circuit metal structure to be fabricated on the conductive substrate. In a specific embodiment of the invention, a static determination of electric field distributions caused by a time invariant point current source is obtained in the absence of the substrate and subtracted from the electrodynamically obtained electric field distributions from the interaction of a vector potential caused by a time variant point current in the presence of the substrate. The resulting difference values that are valid for all metalization structures fabricated on this type of substrate are stored in a look-up table. Then, when a simulation of the interactions, for example, of an inductor or other system of metals, on a conductive substrate is made the weakly spatially dependent electrodynamic component of the substrate interactions from the look-up table are superimposed on a very efficiently determined static solution for the inductor or other system of metals being simulated. The results of the superimposition are used to generate the overall integrated circuit metal structure on the conductive substrate.

40 Claims, 3 Drawing Sheets

100

400

METHOD AND APPARATUS FOR QUASI FULL-WAVE MODELING OF INTERACTIONS IN CIRCUITS

RELATED APPLICATIONS

U.S. patent applications Ser. Nos. 09/283,392, 09/283,394 and 09/283,395 were filed concurrently herewith.

TECHNICAL FIELD

This invention is related to the design of optimized metalization structures and, more particularly, to modeling of magnetic interactions in circuits to simulate the electrical properties of metalization structures from their physical characteristics.

BACKGROUND OF THE INVENTION

It is desirable to be able to model quickly and accurately the characteristics of metalization structures, such as inductors, interconnects or the like, fabricated in integrated circuits on conductive substrates. Because known conductive substrates interact strongly with electromagnetic fields generated by currents in the integrated circuit, an accurate electrodynamic model of the electromagnetic interactions is required in order to properly determine the electrical properties of inductors or other systems of metals, in the integrated circuit. One family of techniques that have been used for this purpose includes so-called full wave solvers that were designed primarily for antenna simulation. However, the full wave solvers are very inefficient, i.e., slow, when employed in an attempt to model structures that are relatively small compared to the wavelength of a signal propagating in metalization structured fabricated in integrated circuits. Another family of techniques includes so-called static or quasi-static solvers that are significantly faster than the full wave solvers in arriving at a model, but yield very inaccurate results for integrated circuits fabricated on or in the vicinity of conductive substrates.

SUMMARY OF THE INVENTION

These and other problems and limitations of prior known modeling arrangements and methods are overcome by employing electrodynamically determined electric field and/or current distributions in conjunction with statically determined electric field distributions localized to metalization structures on a conductive substrate to model metal structures to be fabricated on a substrate. Specifically, the static electric field distributions are subtracted from the electrodynamic field distributions and the results are used to determine the electrodynamic component of self and mutual interactions between metalization structures to be fabricated on the conductive substrate. Then, statically determined current interactions of the metalization structures to be fabricated are determined and superimposed on the electrodynamic interactions. The results of the superimposition are used to generate the overall circuit metal structure to be fabricated on the conductive substrate.

In a specific embodiment of the invention, a static determination of electric field distributions caused by a time invariant point current source is obtained in the absence of the substrate and subtracted from the electrodynamically obtained electric field distributions from the interaction of a vector potential caused by a time variant point current in the presence of the substrate. The resulting difference values that are valid for all metalization structures fabricated on this type of substrate are stored in a look-up table. Then, when a simulation of the interactions, for example, of an inductor or other system of metals, on a conductive substrate is made the weakly spatially dependent electrodynamic component of the substrate interactions from the look-up table are superimposed on a very efficiently determined static solution for the inductor or other system of metals being simulated. The results of the superimposition are used to generate the overall integrated circuit metal structure on the conductive substrate.

DETAILED DESCRIPTION

A. Theoretical Discussion

Figure 1:
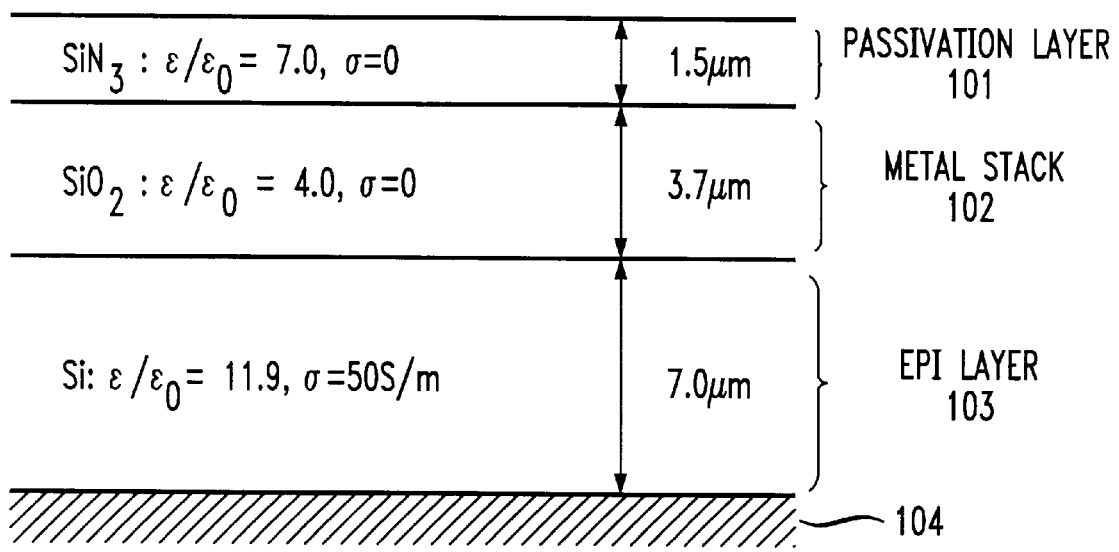
FIG. 1 shows, in simplified form, a cross section of an integrated circuit wafer on which metalization structures may be fabricated in accordance with the invention.

Note that for simplicity and clarity of exposition, the embodiments of the invention are described herein in terms of inductors being fabricated on integrated circuit conductive substrates. However, it will be understood by those skilled in the art that inductors and other metal structures may be fabricated on other types of substrates, for example, on printed circuits, multi-chip module substrates or the like.

For metalization structures, for example, inductors or the like, fabricated on integrated circuit conductive substrates, a large component of the magnetic fields arising from the metalization currents are reflected from the conductive substrate at a phase shifted from that of the incident phase. The electric fields resulting from this component of the magnetic field are at a phase shift of $\sim\pi/4$ with respect to the inductor current, and, as a result, they contribute both a correction to the inductance and to the dominant component of the series resistance at microwave frequencies. In order to accurately model the characteristics of these inductors, it is necessary to accurately determine the magnitudes and phases of the electric fields arising from the interactions of microwave currents with the integrated circuit substrates, and to integrate those fields over the circuit metals. Below the modeling of integrated inductors on conductive substrates is described; however, the described formalism can be used to accurately predict all electromagnetic interactions occurring between integrated circuit elements on integrated circuit substrates.

Formalism

In order to model the characteristics of integrated circuits, a formalism is needed that accurately describes the electromagnetic fields arising from signals present in the integrated circuit's metalization stack. In inductors on nonconductive substrates the magnetic fields are accurately modeled as if the inductor were in free space and many effective techniques have been developed to solve this problem. Because the integrated circuit substrates strongly affect the inductor fields, we are not able to use these solutions cannot be used directly. However, because the effects of the integrated circuit substrates on the inductor fields are slowly varying functions of position, the series resistances and inductances can be solved for by using these methods and then superimpose the substrate effects on these solutions.

In what follows, the characteristics of the electric field are solved for the electric field generated by a point current source located in the metal stack of an integrated circuit wafer. The resultant electric field is divided into two components: (1) a simple inductor of dimensions<<c/f without substrate interactions (where c is the speed of light and f its frequency), and (2) the effects of the substrate on the inductor. Then, the characteristics of the inductor are solved for by superimposing these substrate interactions onto previously developed inductor modeling techniques. The potential $\Phi$ describing the radiation arising from a point current source of frequency f at r=0 is given as the solution to the inhomogeneous Helmholz wave equation:

$$\left[\nabla^2 + \frac{(2\pi f)^2}{c^2}\right]\Phi(r, f) = \delta(r), \tag{1}$$

where c is the speed of light in the media. The electric field generated by this current element is:

$$E(r) = 2\pi i f \mu_0 \left(\bar{I} + \frac{\nabla\nabla}{k^2}\right)\Phi, \tag{2}$$

where k=2πf/c, $\bar{I}$ is the identity matrix and r is the separation between the source current and the observation point.

The derivatives on the right of Equation 2 describe the electric field from the scalar potential, while $\bar{I}$ determines the component arising from the vector potential. For example, for a metal subunit ~5μm in length, the component of the electric field from the scalar potential will be many orders of magnitude larger than that from the vector potential and will complicate the accurate evaluation of the component arising from the vector potential. However, because of the small size of the subunit, in the self consistent solution of the E electric field on all inductor segments, the component of the electric field arising from the scalar potential will result in a displacement current variation across each segment which is orders of magnitude smaller than the current through that segment. As a result, the scalar component of the electric fields from each metal subunit will be almost completely canceled by the scalar component from the roughly identical currents in adjacent metal subunits. As a result of this cancellation, the electric fields arising from the vector potential are much more important than those from the scalar potential for subunits of dimensions <f/(10c)~1 cm. For these reasons, only the component of the electric field arising from the vector potential is retained in Equation 2, and the effects of the scalar potential is treated through the determination and incorporation of metalization capacitances, which is discuss below.

In inhomogeneous planar media, the form for the electric field in Equation 2 is inconvenient; therefore, it is advantageous to use Somerfeld's identity, namely:

$$\Phi(r, k) = i' \int_0^\infty dk_\rho \frac{k_\rho}{k_z} J_0(k_\rho\rho)\left[e^{ik|z-z'|} + A_+ e^{-ik_z z} + A_- e^{ik_z z}\right], \tag{3}$$

where i'=√−1, z' is the height of the source, $A_+$ is the amplitude of the waves reflected from above, and $A_-$ is the amplitude of the waves reflected from below the metalizations.

Equation 3 decomposes the spherically symmetric form for the electric field into an integral over evanescent and traveling waves ($e^{ik_z|z|}$)in the $\hat{z}$ direction and cylindrically symmetrical waves [$j_o(k_\rho\rho)$] in the $\hat{\rho}$ direction with $k^2 = k_\rho^2 + k_z^2$. For integrated circuit substrates, the wave propagation in the $\hat{z}$ direction is determined by the reflection and transmission coefficients at each dielectric interface that are determined by the frequency dependent dielectric constants of each layer. As discussed, for the integrated circuit process, $A_-$ will be dominated by the electric fields reflected from the conductive substrates. With the determination of $A_+$ and $A_-$, and using Equation 3 the electric fields can be determined at all places in the metalization stack arising from currents anywhere in the metal stack of the integrated circuit wafer.

With the determination of $A_+$ and $A_-$, Green's function is determined, which relates the electric field E(ρ,z)to the current dipole $\hat{x}I(\rho',z')$dl for the~integrated circuit substrate, and is expressed in the following form:

$$E(\rho, z) = \hat{x}I(\rho', z')dl \frac{if}{\varepsilon_0 c^2}\int_0^\infty k_\rho G \cdot J(k_\rho\rho)dk_\rho. \tag{4}$$

Application of Green's Function for Inductor Modeling

As discussed, the form for the electric field in Equation 4 is inconvenient because the integral converges slowly and E diverges as 1/ρ for small ρ, making the evaluation of the self induced electric fields difficult. The divergence can be removed by observing that the magneto static component of the interaction can be isolated as:

$$\frac{1}{2}\int_0^\infty J_0(k_\rho\rho)dk_\rho = \frac{1}{\rho}. \tag{5}$$

As a result, the electric field at (ρ,z) arising from a point current source at (ρ',z') can be written as:

$$\bar{E}(\rho, z) = \tag{6}$$
$$I(\rho', z')\frac{if \cdot dl}{\varepsilon_0 c^2}\left[\int_0^\infty \left(k_\rho G(z, z') - \frac{1}{2}\right)J_0(k_\rho|\rho - \rho'|)dk_\rho + \frac{1}{|\rho - \rho'|}\right]$$

The second term in the square brackets on the right of Equation 6 is Neuman's Equation for the static electric fields generated by current carrying elements in free space with dimensions which are much less than the wavelength of light at the frequency of interest. This term will describe a lossless inductor whose characteristics are independent of frequency and the characteristics of its substrate. Neuman's equation has been solved exactly for the self and mutual inductance of a number of important metalization configurations such as lines with rectangular cross section of arbitrary length and separation. The integral on the right side of Equation 6 is the electrodynamic component and is dominated by the induced substrate currents and describes the difference between an ideal inductor and an inductor fabricated with the integrated circuit processes. It determines, at every point in the metal stack, the in-plane electric field that arises from the interactions of the conductive substrate with any current in the metal stack.

By way of an example, consider the real and imaginary parts of this component at 5 GHz verses ρ for the current integrated circuit substrates. The real part of the electric field corresponds to an increase in series resistance due to substrate image currents and the imaginary part corresponds to a reduction inductive reactance of the circuit metals. Thus, for the integrated circuit substrate, the real and imaginary components have roughly the same magnitude for separations ρ less than ~100 μm. Because the penetration depth in the integrated circuit substrate is ~200 μm, the electric fields arising from the substrate coupling are a slowly varying function of ρ and can be evaluated at intervals of ρ~5 μm and at frequency intervals of ~0.5 GHz. These frequency and position dependent values are stored in the array $\Theta_{f,\rho}$ that is used as a look up table for inductor calculations. Note that the penetration depth is the depth to which the electromagnetic field propagation from a source at the surface of the substrate penetrates into that substrate.

The real part of the electric field corresponds to an increase in series resistance due to substrate image currents and the imaginary part corresponds to a reduction inductive reactance of the circuit metals. Note that for the integrated circuit substrate, the real and imaginary components have roughly the same magnitude for separations ρ less than ~100 μm. Because the penetration depth in the integrated circuit substrate is ~200 μm, the electric fields arising from the substrate coupling are a slowly varying function of ρ and can be evaluated at intervals of ρ5 pm and at frequency intervals of ~0.5 GHz. We store these frequency and position dependent values in the array $\Theta_{f,\rho}$ that we use as a look up table for inductor calculations.

Calculation of Series Impedances

In what follows, it is shown how Equation 6 can be used to create a complex mutual and self inductance matrix fully accounting for substrate image currents. In order to calculate the series inductances and resistances of a RLC ladder that is used to describe an integrated inductor, the characteristics of an isolated inductor are first solved for and, then, the substrate contribution is added. The inductor is broken down into a series of short metal subunits. The static component of the self inductance of a metal subunit of length $Ln_i$, thickness t and width w is given by:

$$Ls_i = \frac{2Ln_i}{\varepsilon_0 c^2} \left( \begin{array}{c} \ln(2ln_i) - \frac{2}{3}\left(\frac{w}{t}\text{Tan}^{-1}\left(\frac{t}{w}\right) + \frac{t}{w}\text{Tan}^{-1}\left(\frac{w}{t}\right)\right) - \frac{37}{12} \\ \frac{1}{12}\left(\frac{w^2}{t^2}\ln\left(1 + \frac{t^2}{w^2}\right) + \frac{t^2}{w^2}\ln\left(1 + \frac{w^2}{t^2}\right)\right) - \frac{1}{2}\ln(t^2 + w^2) \end{array} \right) \quad (7)$$

The zero frequency metal resistance is given by:

$$Rs_i = \frac{Ln_i}{w} Rsq, \quad (8)$$

where Rsq is the metal resistance in ohms per square. The static component of the mutual inductance between two parallel metal subunits of lengths $Ln_i$ and $Ln_j$ of thicknesses $t_i$ and $t_j$ and of widths $w_i$ and $w_j$ which are separated a horizontal distance d normal to their lengths, a distance h normal to the plane of the wafer, and whose endpoints are offset by the distances $x_{a,b}=x_{i,a}-x_{j,b}$ in the direction parallel to their lengths is given by:

$$M_{i,j} = \frac{1}{\varepsilon_0 c^2} \frac{1}{w_i w_j t_i t_j} \quad (9)$$

$$\sum_{a,b=1}^{2} (-1)^{a+b} \sum_{m,n,\mu,\nu=-1}^{1} (-1)^{1/2(m+n+\mu+\nu)} [F(x_{a,b}, d_{m,n}, h_{\mu,\nu}) -$$

$$x_{a,b} H(x_{a,b}, d_{m,n}, h_{\mu,\nu})],$$

where $d_{m,n}=d+mw_i/2+nw_j/2$, and where $h_{\mu,\nu}=h+\mu t_i/2+\nu t_j/2$. The function $F(x_{a,b},d_{m,n},h_{\mu,\nu})$ on the right hand side of Equation 9 is given by:

$$F(x, d, h) = \frac{\sigma(4x^2 - d^4 - h^4)}{60} + \quad (10)$$

$$\frac{\sigma(2d^2h^2 - 3x^2(d^2 + h^2))}{40} + \frac{d}{24}(h^4 + 6x^2h^2 - 3x^4)\ln(d+\sigma) -$$

$$\frac{x^3}{3}dh \cdot \arctan\left(\frac{dh}{x\sigma}\right) + \frac{h}{24}(d^4 + 6x^2d^2 - 3x^4)\ln(h+\sigma)$$

where $\sigma=\sqrt{x^2+d^2+h^2}$. The other function $H(x_{a,b},d_{m,n},h_{\mu,\nu})$ on the right hand side of Equation 9 is given by:

$$H(x, d, h) = \frac{xd}{6}(3h^2 - x^2)\ln(d+\sigma) - \quad (11)$$

$$\frac{x\sigma}{8}\left(d^2 + h^2 - \frac{2x^2}{3}\right) + \frac{xh}{6}(3d^2 - x^2)\ln(h+\sigma) -$$

$$\frac{1}{24}(d^4 + h^4 - 6d^2h^2)\ln(h+\sigma) - \frac{25}{48}d^2h^2 - \frac{dh}{6}$$

$$\left\{ d^2\left[\arctan\left(\frac{xh}{\sigma d}\right) - \arctan\left(\frac{h}{d}\right)\right] + h^2\left[\arctan\left(\frac{xd}{\sigma h}\right) - \arctan\left(\frac{d}{h}\right)\right] + \right.$$
$$\left. 3x^2\arctan\left(\frac{xh}{\sigma d}\right) \right\}$$

For non parallel subunits, the static component of the mutual inductance is generally less important since these have larger mean separations. The mutual inductance for non parallel subunits has also been calculated. However, it can be found from the second term on the right of Equation 6 divided by 2πif and integrated over the length of both metalizations:

$$M_{i,j} = \frac{1}{\varepsilon_0 c^2} \int_0^{Ln_i} \int_0^{Ln_j} \frac{1}{\rho} \overline{dl_i} \cdot \overline{dl_j}, \quad (12)$$

where ρ is the separation between the vector elements $\overline{dl_i}$ and $\overline{dl_j}$ of subunits $l_i$ and $l_j$.

The electrodynamic component of the inductance and resistance arising from the substrate interactions can be understood as follows: as a result of the high substrate conductivities in the integrated circuit processes every metal current produces an additional voltage across itself and every other metalization. The magnitude and phase of these voltages are determined by the magnitude and phase of the current and multiplied by the f and ρ dependent complex substrate interaction coefficients $\Theta_{f,\rho}$ (determined by the integral on the right of Equation 6). To determine the effective mutual and self impedances generated by the electrodynamic component of the substrate coupling, the following equation is employed, namely:

$$Z_{i,j} = \sum_0^{\frac{Ln_j}{\Delta l_j}} \sum_0^{\frac{Ln_i}{\Delta l_i}} \Theta_{f,\rho} \overline{\Delta l_i} \cdot \overline{\Delta l_j}, \quad (13)$$

where the $\Theta_{f,\rho}$ are coefficients from the substrate coupling matrix, the vectors $\overline{\Delta l_i}$ and $\overline{\Delta l_j}$ are the summation intervals, ρ is the separation between the centers of the summation intervals, and the summations are over every subunit in the inductor including its input and output leads. The series impedances described in Equations 6 through 13 are combined in the form:

$$V_i - V_{i-1} = (2\pi i f Ls_i + Rs_i + Z_{i,i})I_i + 2\pi i f \sum_{j \neq i} I_j(M_{i,j} + Z_{i,j}), \qquad (14)$$

where $V_i - V_{i-1}$ is the voltage across the $i^{th}$ metal subunit arising from the currents in each of the $j^{th}$ subunits.

The image current component to the series resistance grows linearly with frequency above ~1 GHz and is roughly proportional to the number of turns squared. The ohmic resistance is roughly frequency independent and grows as the number of turns. As a result, for a typical integrated inductor, image currents become the dominant source of series resistance for f greater than ~1 GHz. At f=5 GHz, the image current induced series resistance is ~5 times greater than the metal resistance for this inductor. The reduction in inductance arising from image currents is less pronounced since both the correction to the inductance and the inductance grow in proportion to the number of turns squared.

To calculate the characteristics of an actual metalization structure, for example, an inductor, the series impedances in Equation 14 that we have corrected for skin effect are combined with a set of linear equations describing the parallel impedances in the following form:

$$I_{j-1} - I_j = \frac{V_j}{Zp_j} + 2\pi i f \sum_{i \neq j}(V_j - V_i)C_{i,j}. \qquad (15)$$

In Equation 15, the $I_{j-1}-I_j$ represent currents that are diverted from the series paths through parallel impedances. In Equation 15, the $Zp_j$, describing the capacitive and resistive impedances to the grounded substrate are much more important than the $C_{i,j}$ which describe inter subunit capacitances. The resulting system of equations (Equations 14 and 15) is solved for the 2-port frequency dependent network impedances. From an initial solution for the currents in each subunit, the approximation for skin effect losses for the subunits can be refined and then the system can be resolved.

B. Preferred Embodiment(s)

FIG. 1 shows, in simplified form, a cross section of an integrated circuit wafer 100 on which metalization structures may be fabricated in accordance with the invention. The upper surface of wafer 100 is covered by a 1.5 μm thick $SiN_3$ cap 101 with a relative dielectric constant of 7, i.e., the passivation layer. Beneath cap 101 there are several layers 102 of metalization separated by $SiO_2$, i.e., the metal stack. Under the layers 102 separated by $SiO_2$ is a lightly doped 7 μm thick epi layer 103 with a dielectric constant of 11.9 and a conductivity of ~50 $(106\text{ m})^{-1}$. Underlying the epi layer 103 is the 762 μm thick doped p+ substrate 104 that has a conductivity of between (10 and 17000 $(\Omega m)^{-1}$.

Figure 2:
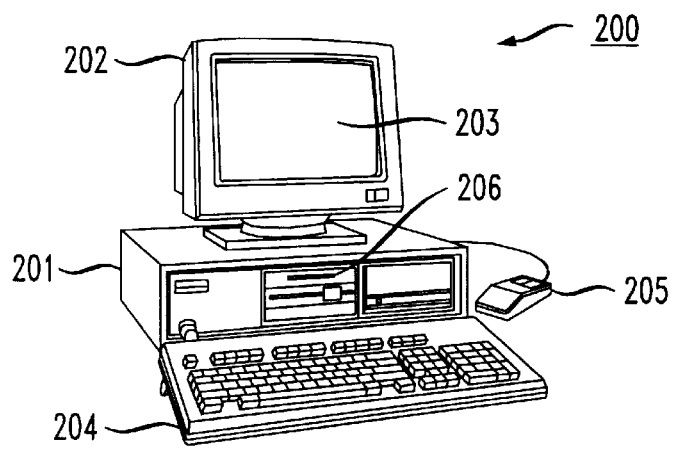
FIG. 2 shows, in simplified form, simulation apparatus including an embodiment of the invention.

FIG. 2 shows, in simplified form, simulation apparatus including an embodiment of the invention. Thus, shown is computer system 200 which may be, for example, a workstation of a type well known in the art, including a central processor, system memory, hard disk and the like (not shown) but housed in cabinet 201. Also included are monitor 202, display unit 203, keyboard 204 and pointing device, i.e., mouse 205. Cabinet 201 also houses a CD-ROM drive 206. The hard disk and system memory are employed in well known fashion to store and retrieve software programs incorporating code for effecting an embodiment of the invention. Additionally, cabinet 201 may also house a floppy disk drive (not shown).

Figure 3:
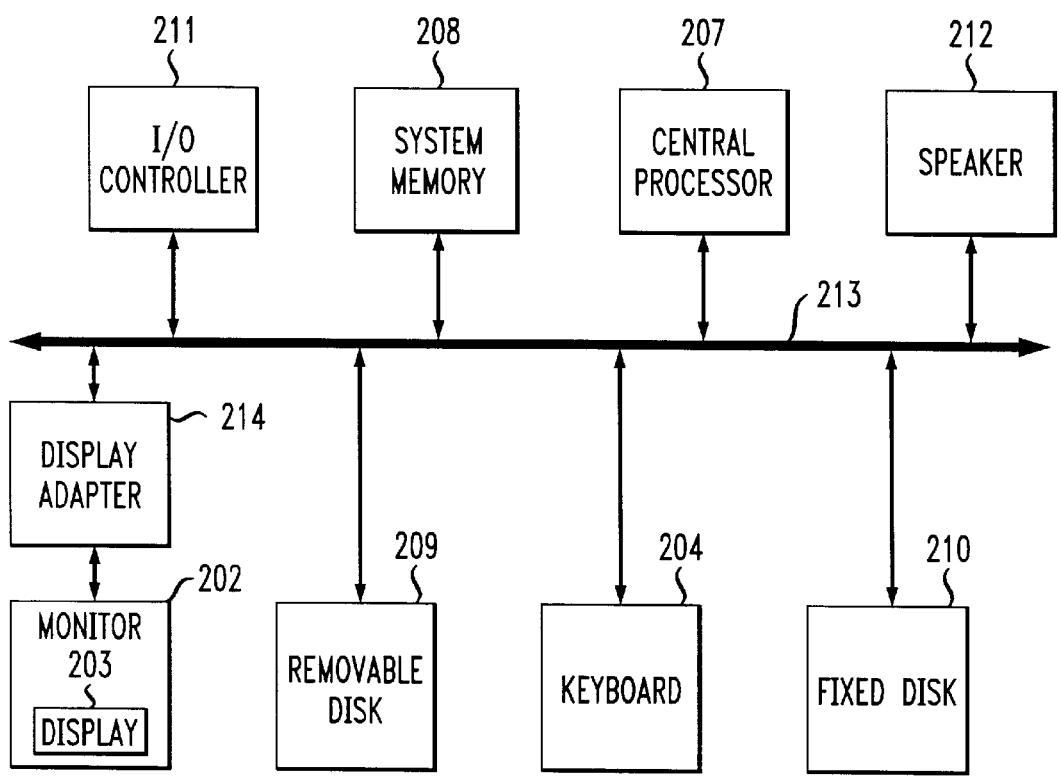
FIG. 3 shows, in simplified block diagram form, details of the apparatus of FIG. 2.

FIG. 3 shows, in simplified block diagram form, details of the apparatus of FIG. 2. Thus, shown is computer system 200 including monitor 202 including display unit 203, display adapter 214, keyboard 204, mouse 205, central processor 207, system memory 208, removable disk drive 209, hard disk drive 210, I/O controller 211 and speaker 212 all interconnected via bus 213. Indeed, FIG. 3 illustrates but one arrangement for implementing an embodiment of the invention and other similar arrangements may be employed to equally practice one or more embodiments of the invention.

Figure 4:
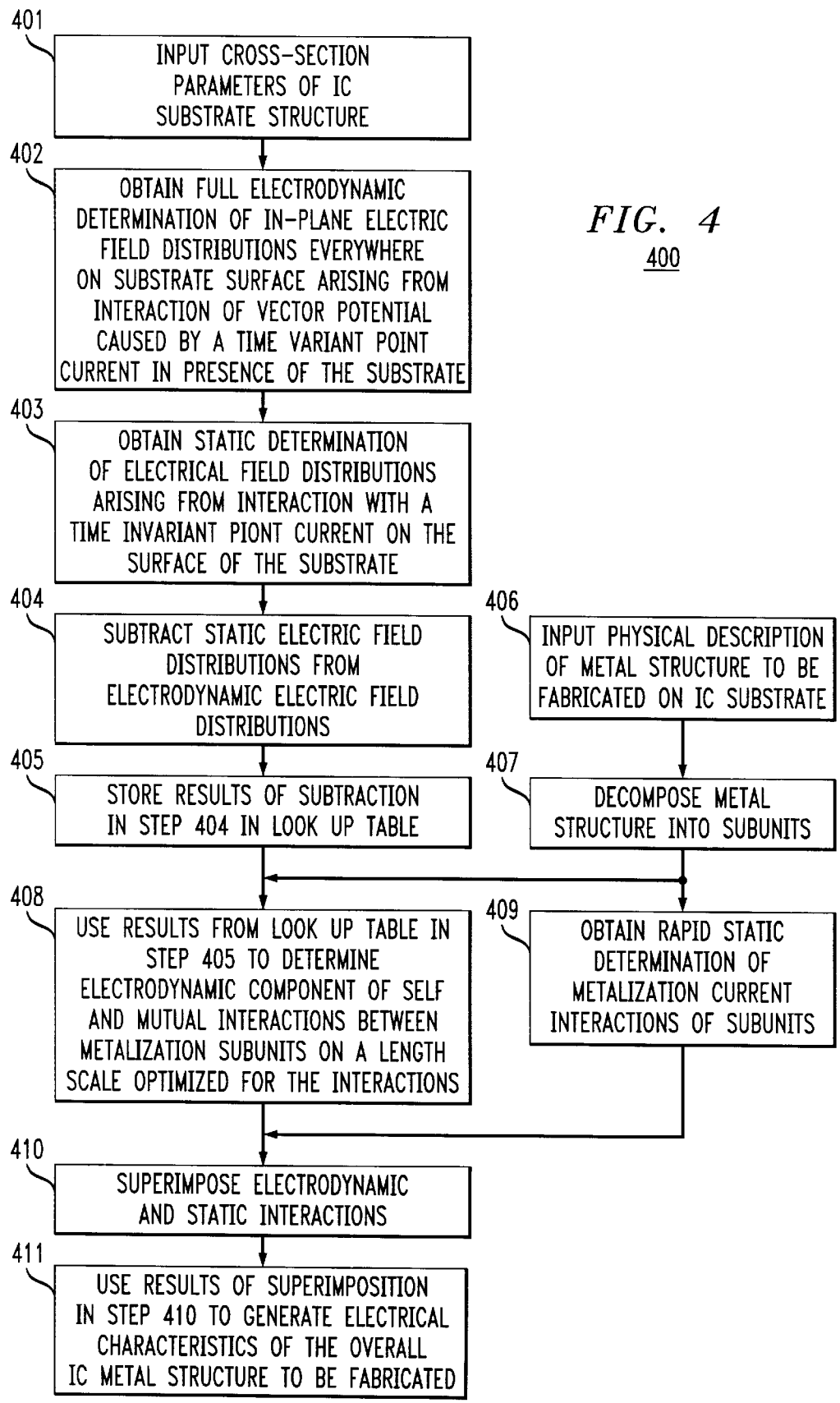
FIG. 4 is a flowchart illustrating steps in one embodiment of a simulation process including an embodiment of the invention.

FIG. 4 is a flowchart illustrating steps in one embodiment of a simulation process including an embodiment of the invention. In this embodiment, the flowchart of FIG. 4 when employed in the simulation apparatus of FIGS. 2 and 3 effects a so-called "quasi dynamic metal process and apparatus" for modeling metal structures on conductive substrates. In step 401 cross-section parameters of the integrated circuit (IC) substrate structure (FIG. 1) are inputted. Thereafter, in step 402 a full electrodynamically determination of in-plane electrical field distributions is obtained everywhere on the substrate surface arising from the interaction of a vector potential caused by a time variant point current in the presence of the substrate. This is realized in accordance with Equations 2 through 4 as described above in the theoretical discussion. Step 403 obtains, in accordance with Equation 5 as described above, a static determination of electric field distributions arising from the interaction with a time invariant point current on the surface of the substrate. The static electric field distributions are subtracted from the electrodynamic electric field distributions in step 404, in accordance with Equation 6 as described above. Step 405 causes the results of the subtraction in step 404 to be stored in a look up table. The stored results from step 405 are supplied to step 408. In step 406, the physical description is inputted of the metal structure that is to be fabricated on the conductive integrated circuit substrate. Step 407 causes the inputted metal structure to be decomposed into metalization structure subunits. Step 408 employs the results stored in the look up table in step 405, in accordance with Equation 13 as described above, to determine the electrodynamic component of self and mutual interactions between the metalization subunits on a length scale optimized for the interactions. The determined electrodynamic components of step 408 are supplied to step 410. Then, step 409 causes a rapid static determination to be obtained of metalization current interactions of the metalization structure subunits, in accordance with Equations 7 through 12 as described above. The static metalization current interactions from step 409 are supplied to step 410. Thereafter, step 410 superimposes, in accordance with Equation 14 as described above, the electrodynamic and static interactions from steps 408 and 409, respectively. Step 411 causes the results of the superimposition, in accordance with Equation 14, of step 410 to be used to generate the overall electrical characteristics of the metal structure to be fabricated on the conductive integrated circuit substrate.

What is claimed is:

1. A method for obtaining electrical properties of physical metalization structures to be fabricated in the vicinity of planar conductive substrates comprising the steps of:

storing determined differences between static electric field distributions and electrodynamic electric field distributions;

partitioning of a metal structure to be fabricated into prescribed metalization structure subunits;

determining magneto static interactions between said subunits of said metalization structures;

utilizing said stored results of said differences to obtain electrodynamic components of self and mutual interactions between prescribed ones of said metalization subunits;

superimposing said electrodynamic and said magneto static interactions; and utilizing the results of said superimposing of said electrodynamic and said magneto static interactions of said metalization structure subunits to generate complex electrical characteristics of said overall metalization structure to be fabricated.

2. The method as defined in claim 1 wherein said step of storing includes the steps of determining electrodynamic electric field distributions on a substrate surface, determining static electric field distributions on the surface of said substrate, subtracting said static electric field distributions from said dynamic electric field distributions and storing the results of said subtracting.

3. The method as defined in claim 2 wherein said step of determining electrodynamic electric field distributions includes a step of determining said electrodynamic electric field distributions everywhere on the surface of said substrate.

4. The method as defined in claim 2 wherein said electrodynamic electric field distributions arise from a time variant point current.

5. The method as defined in claim 4 wherein said electrodynamic electric field distributions further arise from interactions of a potential vector caused by said time variant point current in the presence of said substrate.

6. The method as defined in claim 2 wherein said static electric field distributions arise from a time invariant point current.

7. The method as defined in claim 6 wherein said static electric field distributions further arise from interaction with said time invariant point current on the surface of said substrate.

8. The method as defined in claim 2 wherein said step of partitioning includes partitioning said metal structure into a plurality of relatively small metalization subunits.

9. The method as defined in claim 8 wherein said partitioning of said metal structure is such that physical dimensions of each resulting metalization subunit are electrically small dimensions.

10. The method as defined in claim 9 wherein said electrically small dimensions are small relative to a wavelength a signal at a prescribed frequency intended to propagate on said metal structure to be fabricated.

11. The method as defined in claim 2 wherein said complex electrical characteristics include self and mutual impedances.

12. The method as defined in claim 11 wherein values of voltages are developed by said self impedance at a prescribed location in response to a current at said prescribed location.

13. The method as defined in claim 11 wherein values of voltages are developed by said mutual impedance at a prescribed location in response to a current at one or more of other ones of prescribed locations.

14. The method as defined in claim 2 wherein said conductive substrate is a planar conductive substrate; and wherein said superimposing of said electrodynamic and said magneto static interactions is effected at locations on the metalization subunits of said metal structure separated by distances relatively small as compared to a depth of penetration of said electrodynamic field being superimposed into said planar conductive substrate.

15. Apparatus for obtaining electrical properties of physical metalization structures to be fabricated in the vicinity of planar conductive substrates comprising:

means for determining electrodynamic electric field distributions on a substrate surface;

means for determining static electric field distributions on the surface of said substrate;

means for subtracting said static electric field distributions from said electrodynamic electric field distributions;

means for storing the results of said subtracting;

means for partitioning of a metal structure to be fabricated into prescribed metalization structure subunits;

means for determining magneto static interactions between said subunits of said metalization structures;

means for utilizing said stored results of said subtracting to obtain electrodynamic components of self and mutual interactions between prescribed ones of said metalization subunits;

means for superimposing said electrodynamic and said magneto static interactions; and means for utilizing the results of said superimposing of said electrodynamic and said magneto static interactions to generate complex electrical characteristics of said overall metalization structure to be fabricated.

16. The invention as defined in claim 15 wherein said means for determining electrodynamic electric field distributions includes means for determining said electrodynamic electric field distributions everywhere on the surface of said substrate.

17. The invention as defined in claim 15 wherein said electrodynamic electric field distributions arise from a time variant point current.

18. The invention as defined in claim 17 wherein said electrodynamic electric field distributions further arise from interactions of a potential vector caused by said time variant point current in the presence of said substrate.

19. The invention as defined in claim 15 wherein said static electric field distributions arise from a time invariant point current.

20. The invention as defined in claim 19 wherein said static electric field distributions further arise from interaction with said time invariant point current on the surface of said substrate.

21. The invention as defined in claim 15 wherein said means for partitioning further partitions said metal structure into a plurality of relatively small metalization subunits.

22. The invention as defined in claim 21 wherein said means for partitioning partitions said metal structure such that physical dimensions of each resulting metalization subunit are electrically small dimensions.

23. The invention as defined in claim 22 wherein said electrically small dimensions are small relative to a wavelength a signal at a prescribed frequency intended to propagate on said metal structure to be fabricated.

24. The invention as defined in claim 15 wherein said complex electrical characteristics include self and mutual impedances.

25. The invention as defined in claim 24 wherein values of voltages are developed by said self impedance at a prescribed location in response to a current at said prescribed location.

26. The invention as defined in claim 24 wherein values of voltages are developed by said mutual impedance at a prescribed location in response to a current at one or more of other ones of prescribed locations.

27. The invention as defined in claim 15 wherein said conductive substrate is a planar conductive substrate; and wherein said means for superimposing superimposes said electrodynamic and said magneto static interactions at locations on the metalization subunits of said metal structure separated by distances relatively small as compared to a depth of penetration of said electrodynamic field being superimposed into said planar conductive substrate.

28. Apparatus for obtaining electrical properties of physical metalization structures to be fabricated in the vicinity of planar conductive substrates comprising:

determination apparatus for determining electrodynamic electric field distributions on a substrate surface;

determination apparatus for determining static electric field distributions on the surface of said substrate;

a subtractor for subtracting said static electric field distributions from said electrodynamic electric field distributions;

a storage unit for storing the results of said subtracting;

a partitioner for partitioning of a metal structure to be fabricated into prescribed metalization structure subunits;

determination apparatus for determining magneto static interactions between said subunits of said metalization structures;

utilization apparatus for utilizing said stored results of said subtracting to obtain electrodynamic components of self and mutual interactions between prescribed ones of said metalization subunits;

superimposition apparatus for superimposing said electrodynamic and said magneto static interactions; and a generator supplied with the results of said superimposing of said electrodynamic and said magneto static interactions for generating complex electrical characteristics of said overall metalization structure to be fabricated.

29. The invention as defined in claim 28 wherein said determination apparatus for determining electrodynamic electric field distributions determines said electrodynamic electric field distributions everywhere on the surface of said substrate.

30. The invention as defined in claim 28 wherein said electrodynamic electric field distributions arise from a time variant point current.

31. The invention as defined in claim 30 wherein said electrodynamic electric field distributions further arise from interactions of a potential vector caused by said time variant point current in the presence of said substrate.

32. The invention as defined in claim 28 wherein said static electric field distributions arise from a time invariant point current.

33. The invention as defined in claim 32 wherein said static electric field distributions further arise from interaction with said time invariant point current on the surface of said substrate.

34. The invention as defined in claim 28 wherein said partitioner further partitions said metal structure into a plurality of relatively small metalization subunits.

35. The invention as defined in claim 34 wherein said partitioner partitions said metal structure such that physical dimensions of each resulting metalization subunit are electrically small dimensions.

36. The invention as defined in claim 35 wherein said electrically small dimensions are small relative to a wavelength a signal at a prescribed frequency intended to propagate on said metal structure to be fabricated.

37. The invention as defined in claim 28 wherein said complex electrical characteristics include self and mutual impedances.

38. The invention as defined in claim 37 wherein values of voltages are developed by said self impedance at a prescribed location in response to a current at said prescribed location.

39. The invention as defined in claim 37 wherein values of voltages are developed by said mutual impedance at a prescribed location in response to a current at one or more of other ones of prescribed locations.

40. The invention as defined in claim 28 wherein said conductive substrate is a planar conductive substrate; and wherein said superimposition apparatus includes apparatus for superimposing said electrodynamic and said magneto static interactions at locations on the metalization subunits of said metal structure separated by distances relatively small as compared to a depth of penetration of said electrodynamic field being superimposed into said planar conductive substrate.

* * * * *